United States Patent
Saruki et al.

(10) Patent No.: US 7,545,139 B2
(45) Date of Patent: Jun. 9, 2009

(54) TESTING METHOD AND APPARATUS OF THIN-FILM MAGNETIC HEAD

(75) Inventors: Shunji Saruki, Tokyo (JP); Takumi Uesugi, Tokyo (JP); Tsuyoshi Umehara, Tokyo (JP); Yosuke Antoku, Tokyo (JP)

(73) Assignee: TDK Corporation, Tokyo (JP)

( * ) Notice: Subject to any disclaimer, the term of this patent is extended or adjusted under 35 U.S.C. 154(b) by 188 days.

(21) Appl. No.: 11/740,015

(22) Filed: Apr. 25, 2007

(65) Prior Publication Data

US 2008/0266718 A1 Oct. 30, 2008

(51) Int. Cl.
*G01R 33/12* (2006.01)

(52) U.S. Cl. ...................................... 324/210

(58) Field of Classification Search ......... 324/210–212, 324/263
See application file for complete search history.

(56) References Cited

U.S. PATENT DOCUMENTS

| | | | | |
|---|---|---|---|---|
| 5,742,446 A | * | 4/1998 | Tian et al. | 360/75 |
| 5,854,554 A | * | 12/1998 | Tomita et al. | 324/210 |
| 6,479,988 B2 | * | 11/2002 | Hachisuka et al. | 324/210 |
| 6,538,430 B2 | * | 3/2003 | Carrington et al. | 324/210 |

FOREIGN PATENT DOCUMENTS

| | | |
|---|---|---|
| JP | 2002-63707 | 2/2002 |
| JP | 2002-133621 | 5/2002 |
| JP | 2005-158195 | 6/2005 |
| JP | 2006-66873 | 3/2006 |

* cited by examiner

*Primary Examiner*—Jay M Patidar
(74) *Attorney, Agent, or Firm*—Oblon, Spivak, McClelland, Maier & Neustadt, P.C.

(57) ABSTRACT

A testing method of a thin-film magnetic head has an MR read head element with a multi-layered structure including a magnetization-fixed layer, a magnetization-free layer and a non-magnetic intermediate layer or a tunnel barrier layer sandwiched between the magnetization-fixed layer and the magnetization-free layer. The method includes a step of feeding through the MR read head element a sense current, a step of measuring non-signal output versus frequency characteristics of the MR read head element over a frequency range that covers at least FMR of the magnetization-fixed layer, and a step of discriminating whether the thin-film magnetic head is a head providing high-temperature noises by comparing a frequency of a peak of the non-signal output resulting from FMR of the magnetization-fixed layer with a threshold.

20 Claims, 8 Drawing Sheets

TESTING METHOD AND APPARATUS OF THIN-FILM MAGNETIC HEAD

BACKGROUND OF THE INVENTION

1. Field of the Invention

The present invention relates to testing method and apparatus of a thin-film magnetic head with a magnetoresistive effect (MR) read head element having a multi-layered structure that includes a magnetization-fixed layer and a magnetization-free layer.

2. Description of the Related Art

As hard disk drive apparatuses (HDD) increase in capacity and reduce in size, highly sensitive and high-output thin-film magnetic heads are being demanded. In order to satisfy the demand, performance of giant magnetoresistive effect (GMR) thin-film magnetic heads with GMR read head elements are being improved. On the other hand, tunnel magnetoresistive effect (TMR) thin-film magnetic heads with TMR read head elements having a magnetoresistivity ratio more than twice as high as that of the GMR thin-film magnetic heads are being developed.

Among the thin-film magnetic heads with such GMR or TMR read head elements having a multi-layered structure, some heads may produce noises when their environment temperature becomes high. Thus, after fabricating the thin-film magnetic heads, it is necessary to check that the fabricated heads never produce such noises or high-temperature noises.

Figure 1A:
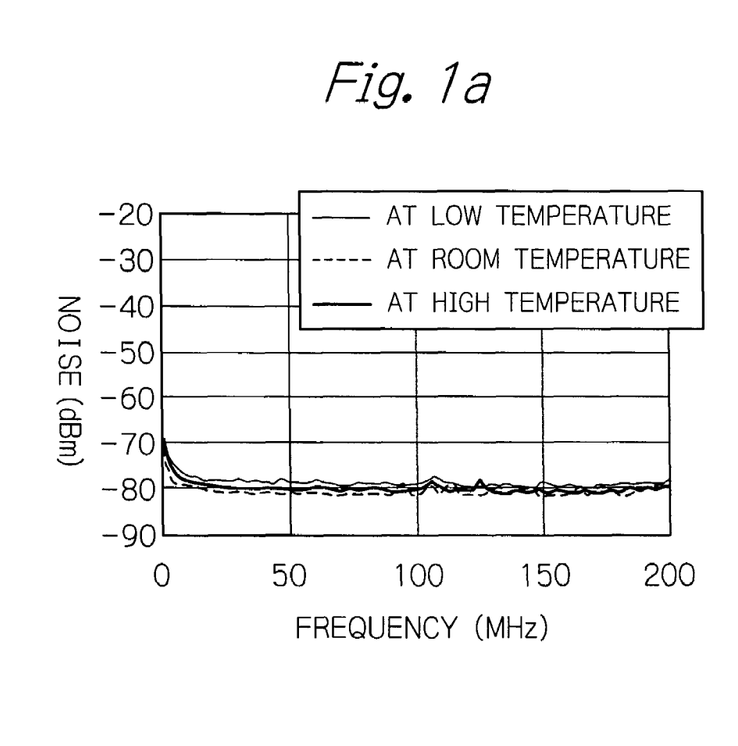
FIGS. 1a and 1b, already described, are views illustrating non-signal output versus frequency characteristics of a good thin-film magnetic head providing no high-temperature noise and of a defective thin-film magnetic head providing high-temperature noises.
Figure 1B:
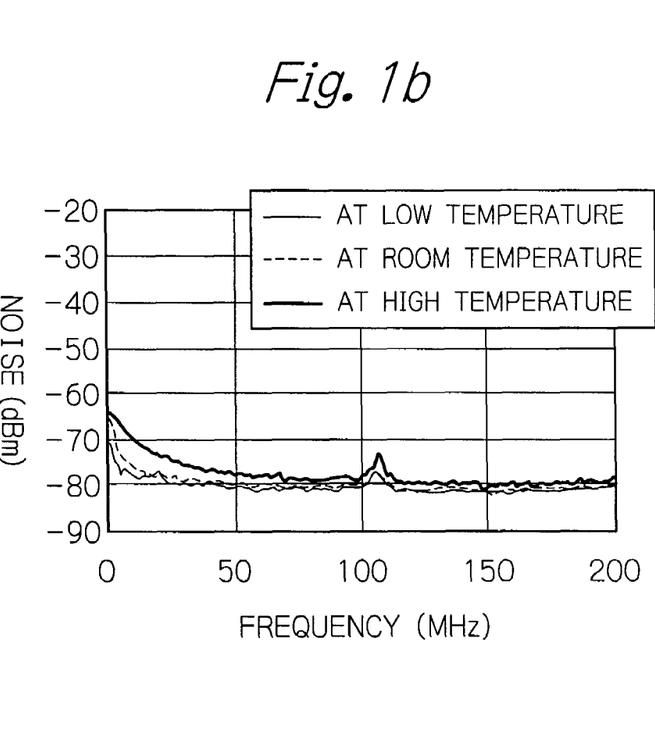

FIGS. 1a and 1b illustrate non-signal output versus frequency characteristics of a good thin-film magnetic head providing no high-temperature noise and of a defective thin-film magnetic head providing high-temperature noises, respectively. In these figures, lateral axis indicates frequency (MHz) and longitudinal axis indicates non-signal output represented by power, namely noise (dBm). In this case, a low temperature corresponds to $-10°$ C., a room temperature corresponds to $-25-30°$ C. and a high temperature corresponds to $85°$ C.

Since the noise hardly changes depending upon the temperature change, the thin-film magnetic head corresponding to FIG. 1a is a good element providing no high-temperature noise. Contrary to this, since the noise increases when the temperature increases, the thin-film magnetic head corresponding to FIG. 1b is a defective element providing high-temperature noises.

Generally, in order to check whether a thin-film magnetic head produces high-temperature noises or not, it is necessary to measure a noise level in an output signal from the thin-film magnetic head under a condition where its environment temperature is actually increased to a high temperature. However, increasing in the environment temperature of the thin-film magnetic head from a room temperature to a high temperature at each measurement takes much expense in time and effort, and therefore the check procedure becomes extremely complicated and the check time becomes much long.

SUMMARY OF THE INVENTION

It is therefore an object of the present invention to provide testing method and apparatus of a thin-film magnetic head, whereby it is possible to extremely easily and quickly check whether the thin-film magnetic head is a defective head that will produce high-temperature noises or not.

A testing method of a thin-film magnetic head has an MR read head element with a multi-layered structure including a magnetization-fixed layer, a magnetization-free layer and a nonmagnetic intermediate layer or a tunnel barrier layer sandwiched between the magnetization-fixed layer and the magnetization-free layer. According to the present invention, the method includes a step of feeding through the MR read head element a sense current, a step of measuring non-signal output versus frequency characteristics of the MR read head element over a frequency range that covers at least a ferromagnetic resonance (FMR) of the magnetization-fixed layer, and a step of discriminating whether the thin-film magnetic head is a head providing high-temperature noises by comparing a frequency of a peak of the non-signal output resulting from FMR of the magnetization-fixed layer with a threshold.

A non-signal output, that is a wide band spectrum of noise, from an MR read head element of a thin-film magnetic head to be tested is measured, a frequency of a peak resulting from FMR of a magnetization-fixed layer of the MR read head element is obtained, and then the frequency of the peak is compared with a threshold frequency of 10 GHz so as to discriminate whether this thin-film head is a defective one providing high-temperature noises or not. Since the wide range spectrum within which a FMR of the magnetization-fixed layer will be appeared is measured and a frequency position of a peak due to the FMR is compared with the threshold, it is possible to judge, under a room temperature environment, not under a high temperature environment, whether the thin-film head is a defective one providing high-temperature noises or not. As a result, extremely easy and quick test can be performed for checking whether the thin-film magnetic head is defective or not.

It is preferred that the discriminating step includes discriminating that the thin-film magnetic head is a head providing high-temperature noises when the frequency of the peak of the non-signal output is lower than the threshold.

It is also preferred that the discriminating step includes obtaining a frequency at which the measured non-signal output peaks within a predetermined frequency range, and comparing the obtained frequency with the threshold.

It is further preferred that the measuring step includes measuring non-signal output versus frequency characteristics of the MR read head element over a wide frequency range of 1 GHz or more.

It is still further preferred that the measuring step includes measuring non-signal output versus frequency characteristics of the MR read head element under a room-temperature environment.

It is further preferred that the thin-film magnetic head is one of thin-film magnetic heads formed on a wafer to arrange in matrix, one of thin-film magnetic heads formed on a bar member to align, a thin-film magnetic head formed on a magnetic head slider individually separated, or a thin-film magnetic head formed on a magnetic head slider individually separated and assembled with a support member.

It is still further preferred that the thin-film magnetic head is a thin-film magnetic head with a GMR read head element or a TMR read head element.

A testing apparatus of a thin-film magnetic head has an MR read head element with a multi-layered structure including a magnetization-fixed layer, a magnetization-free layer and a nonmagnetic intermediate layer or a tunnel barrier layer sandwiched between the magnetization-fixed layer and the magnetization-free layer. According to the present invention, also, the apparatus includes a unit of feeding through the magnetoresistive effect read head element a sense current, a unit of measuring non-signal output versus frequency characteristics of the magnetoresistive effect read head element over a frequency range that covers at least a ferromagnetic resonance of the magnetization-fixed layer, and a unit of discriminating whether the thin-film magnetic head is a head providing high-temperature noises by comparing a frequency of a peak of the non-signal output resulting from a ferromagnetic resonance of the magnetization-fixed layer with a threshold.

A non-signal output, that is a wide band spectrum of noise, from an MR read head element of a thin-film magnetic head to be tested is measured, a frequency of a peak resulting from FMR of a magnetization-fixed layer of the MR read head element is obtained, and then the frequency of the peak is compared with a threshold frequency of 10 GHz so as to discriminate whether this thin-film head is a defective one providing high-temperature noises or not. Since the wide range spectrum within which a FMR of the magnetization-fixed layer will be appeared is measured and a frequency position of a peak due to the FMR is compared with the threshold, it is possible to judge, under a room temperature environment, not under a high temperature environment, whether the thin-film head is a defective one providing high-temperature noises or not. As a result, extremely easy and quick test can be performed for checking whether the thin-film magnetic head is defective or not.

It is preferred that the discriminating unit includes a unit of discriminating that the thin-film magnetic head is a head providing high-temperature noises when the frequency of the peak of the non-signal output is lower than the threshold.

It is preferred also that the discriminating unit includes a unit of obtaining a frequency at which the measured non-signal output peaks within a predetermined frequency range, and a unit of comparing the obtained frequency with the threshold.

It is further preferred that the measuring unit includes a unit of measuring non-signal output versus frequency characteristics of the magnetoresistive effect read head element over a wide frequency range of 1 GHz or more.

It is still further preferred that the measuring unit includes a unit of measuring non-signal output versus frequency characteristics of the magnetoresistive effect read head element under a room-temperature environment.

It is further preferred that the thin-film magnetic head is one of thin-film magnetic heads formed on a wafer to arrange in matrix, one of thin-film magnetic heads formed on a bar member to align, a thin-film magnetic head formed on a magnetic head slider individually separated, or a thin-film magnetic head formed on a magnetic head slider individually separated and assembled with a support member.

It is still further preferred that the thin-film magnetic head is a thin-film magnetic head with a GMR read head element or a TMR read head element.

Further objects and advantages of the present invention will be apparent from the following description of the preferred embodiments of the invention as illustrated in the accompanying drawings.

DESCRIPTION OF THE PREFERRED EMBODIMENTS

Figure 2:
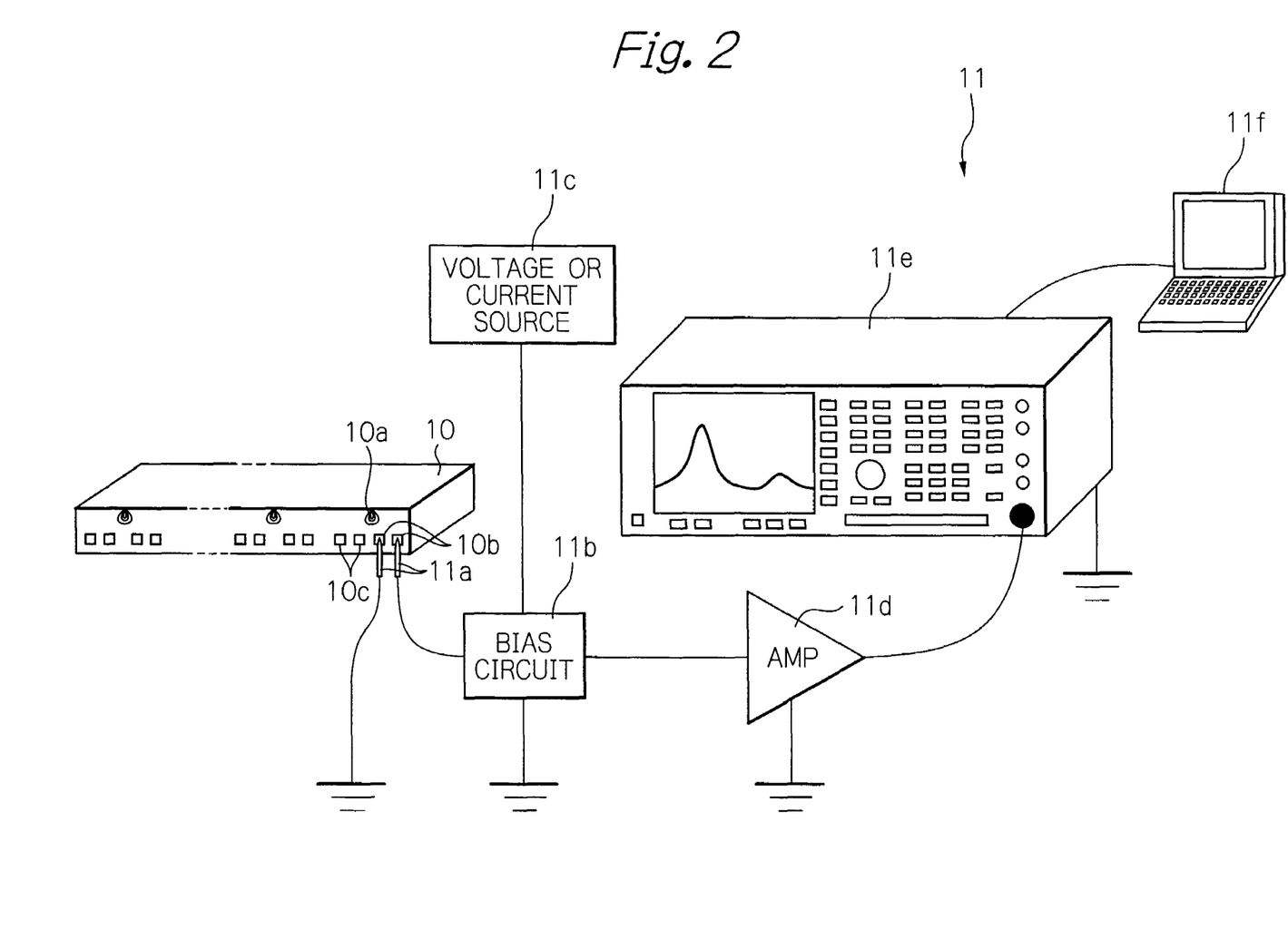
FIG. 2 is a view schematically illustrating a configuration of a testing apparatus of a thin-film magnetic head as a preferred embodiment according to the present invention.

FIG. 2 schematically illustrates a configuration of a testing apparatus of a thin-film magnetic head as a preferred embodiment according to the present invention.

In the figure, reference numeral 10 denotes a bar member with a plurality of thin-film magnetic heads 10a connected in series and aligned with each other, each head having a TMR read head element, and 11 denotes the testing apparatus.

The bar member 10 is fabricated as follows. First, in the wafer process, many of thin-film magnetic heads are formed to arrange in matrix on an integration surface of a thin-film magnetic head wafer. The wafer is then cut into a plurality of bar members, and thereafter an air-bearing surface (ABS) of each bar member 10 is lapped to adjust an MR height. Each thin-film magnetic head 10a in the bar member 10 has a TMR read head element, an inductive write head element, a pair of terminal pads 10b electrically connected to the TMR read head element, and a pair of terminal pads 10c electrically connected to the inductive write head element.

The testing apparatus 11 has a pair of probes 11a capable of coming into electrical contact with the pair of terminal pads 10b for a TMR read head element of a thin-film magnetic head to be tested on the bar member 10, a constant voltage or current source 11c electrically connected to one of the probes 11a through a bias circuit 11b, for supplying a constant voltage or current to the TMR read head element, an amplifier 11d electrically connected to the one of the probes 11a through the bias circuit 11b, for amplifying output from the TMR read head element, a spectrum-analyzer 11e connected to the amplifier 11d to receive an amplified output of the TMR read head element, a digital computer 11f electrically connected the spectrum-analyzer 11e.

The spectrum-analyzer 11e can measure output versus frequency characteristics of the TMR read head element over a wide frequency band of at least about 1-14 GHz. In this embodiment, although it is mere example, a high-performance spectrum-analyzer E4440A (3 Hz-26.5 GHz) of Agilent Technologies, Inc. is used as for the spectrum-analyzer 11e.

Figure 3:
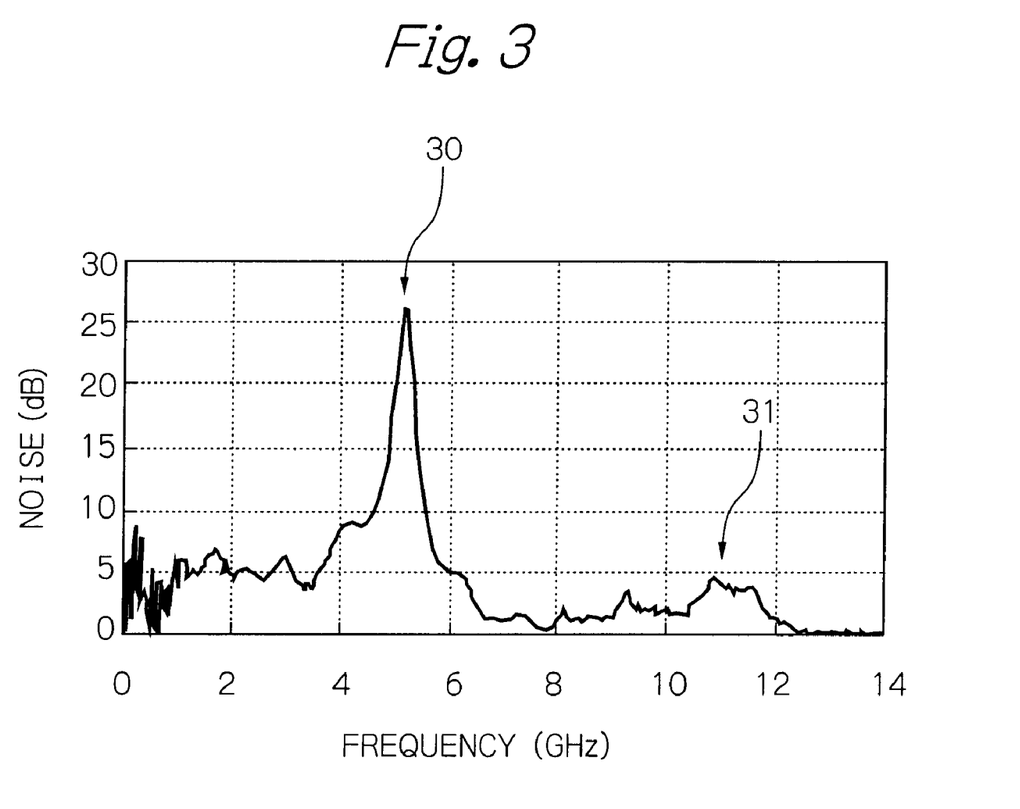
FIG. 3 is a view illustrating non-signal output versus frequency characteristics of a TMR read head element when its noise is widely measured by a spectrum-analyzer.

FIG. 3 illustrates noise versus frequency characteristics when non-signal output or noise of the TMR read head element is widely measured by such spectrum-analyzer 11e. In the figure, the longitudinal axis indicates a noise level by dB. In the wide frequency band measurement, since background noise is high, the background noise is independently measured and the difference between a measured level of non-signal output from the TMR read head element and a measured level of the background noise is indicated as the noise spectrum in the figure.

As is well known, a TMR read head element has a magnetization-fixed layer, a magnetization-free layer and a tunnel barrier layer sandwiched by the magnetization-fixed layer and the magnetization-free layer. When a non-signal output of the TMR read head element is measured for a wide frequency band of about 1-14 GHz, a peak 30 resulting from FMR of the magnetization-free layer and a peak 31 resulting from FMR of the magnetization-fixed layer will be observed as shown in FIG. 3. The peak 30 represents a magnetization state in the magnetization-free layer, and the peak 31 represents a magnetization state in the magnetization-fixed layer.

Inventors of this application found out that a frequency of the peak 31 resulting from FMR of a magnetization-fixed layer of a TMR read head element providing high-temperature noises differs from that of a TMR read head element providing no high-temperature noise and thus reached the present invention. In other words, the inventors found out that the frequency of the peak 31 of a TMR read head element providing high-temperature noises is lower than that of a TMR read head element providing no high-temperature noise.

In this embodiment, whether the thin-film head is a good element providing no high-temperature noise or a defective element providing high-temperature noises is discriminated. This discrimination is performed by judging whether a frequency of the peak 31 resulting from FMR of a magnetization-fixed layer of the head is equal to or higher than a threshold frequency, or not.

Figure 4:
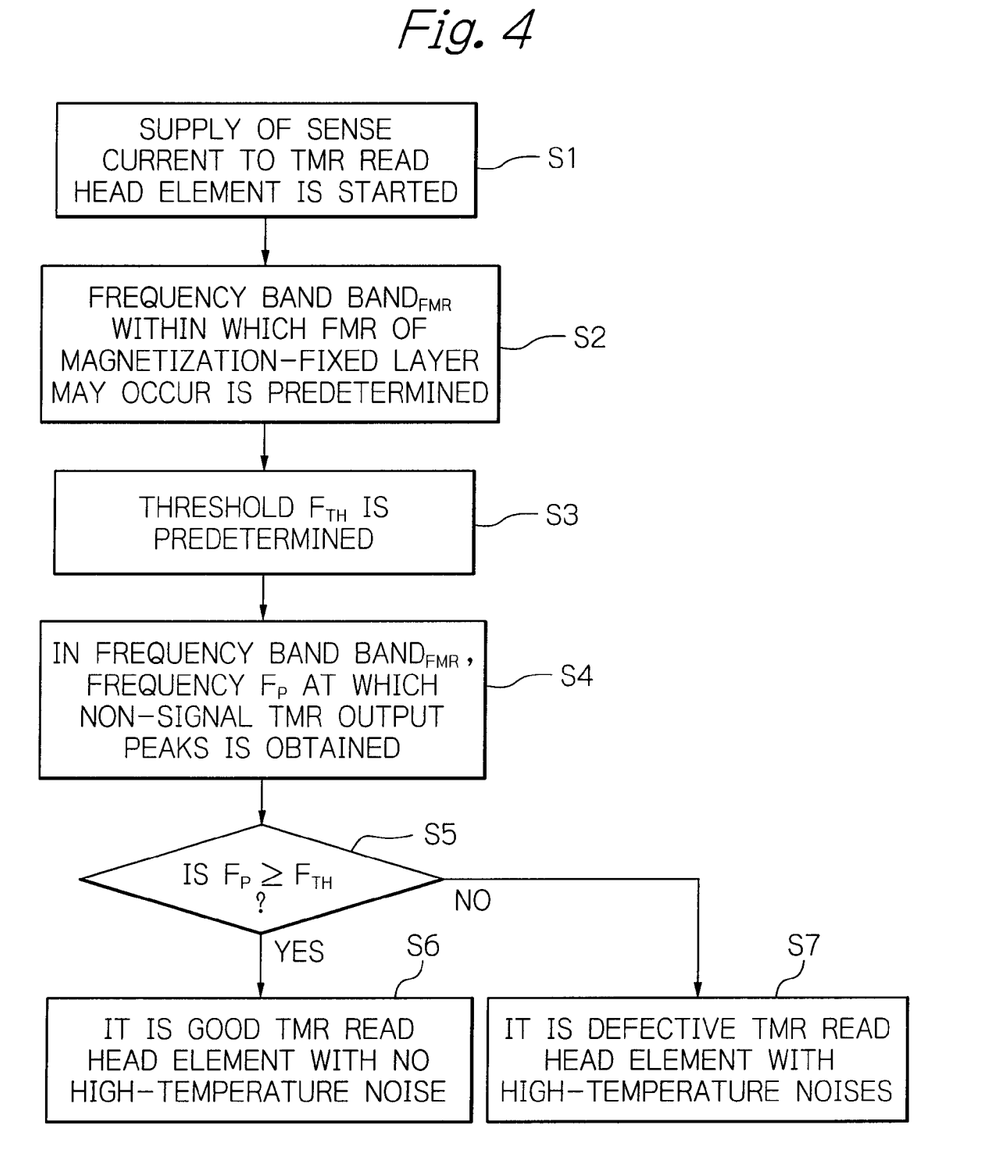
FIG. 4 is a flow chart illustrating a testing procedure in the testing apparatus according to the embodiment shown in FIG. 2.

FIG. 4 illustrates a testing procedure in the testing apparatus according to this embodiment. Hereinafter, operations of the testing apparatus in this embodiment will be described with reference to this figure. The following operations of this embodiment are performed under a room temperature.

First, the pair of probes 11a are come into electrical contact with the pair of terminal pads 10b of the TMR read head element of the thin-film magnetic head to be tested on the bar member 10, and supply of a sense current to the TMR read head element from the constant voltage or current source 11c is started (Step S1).

On the other hand, a frequency band $BAND_{FMR}$ within which FMR of the magnetization-fixed layer of the TMR read head element may occur is predetermined (Step S2). In this embodiment, a frequency range of 8-15 GHz for example is determined as this frequency band $BAND_{FMR}$.

Also, a threshold $F_{TH}$ with respect to a frequency $F_P$ of peak non-signal output due to FMR is predetermined (Step S3). In this embodiment, a frequency of 10 GHz for example is determined as this threshold $F_{TH}$ with respect to the frequency $F_P$ of the peak output.

Then, within the frequency band $BAND_{FMR}$ of 8-15 GHz, a frequency $F_P$ at which non-signal output from the TMR read head element peaks is obtained from a wide noise spectrum of about 1-14 GHz measured by the spectrum analyzer 11e (Step S4). It is presumed that the frequency $F_P$ thus obtained is considered as a frequency at which the output from the TMR read head element peaks due to FMR of the magnetization-fixed layer.

Then, whether the frequency $F_P$ thus obtained is equal to or higher than the threshold frequency $F_{TH}$ ($F_P \geq F_{TH}$), or not is judged (Step S5).

If the frequency $F_P$ is equal to or higher than the threshold frequency $F_{TH}$ ($F_P \geq F_{TH}$), it is discriminated that the TMR read head element tested is a good element with no high-temperature noise (Step S6). Contrary to this, if the frequency $F_P$ is lower than the threshold frequency $F_{TH}$ ($F_P < F_{TH}$), it is discriminated that the TMR read head element tested is a defective element with high-temperature noises (Step S7).

Figure 5A:
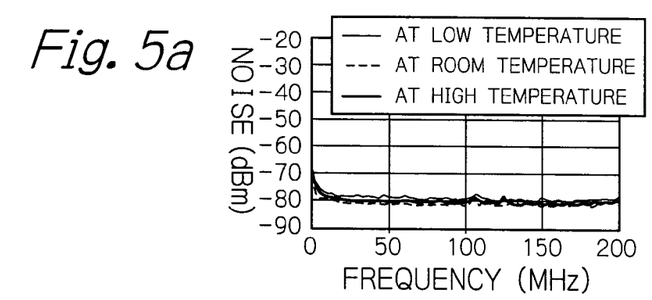
FIGS. 5a and 5b are views illustrating noise versus frequency characteristics of a good thin-film magnetic head providing no high-temperature noise.
Figure 5B:
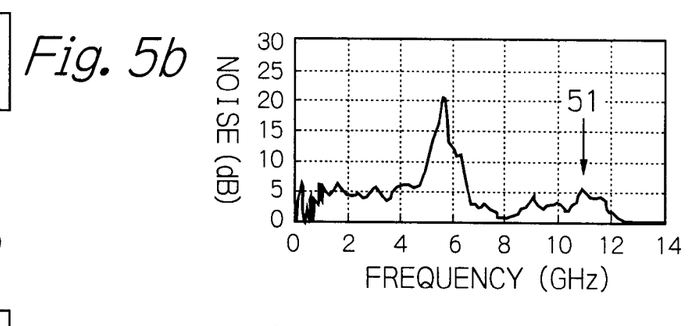
Figure 6A:
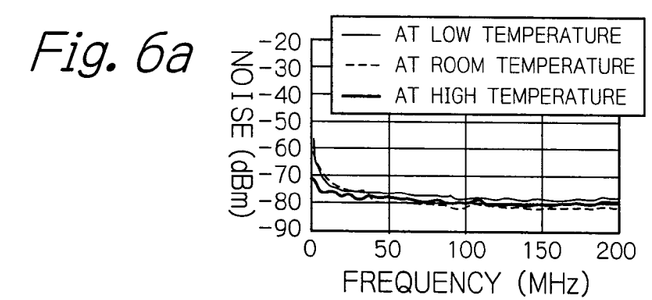
FIGS. 6a and 6b are views illustrating noise versus frequency characteristics of a good thin-film magnetic head providing no high-temperature noise.
Figure 6B:
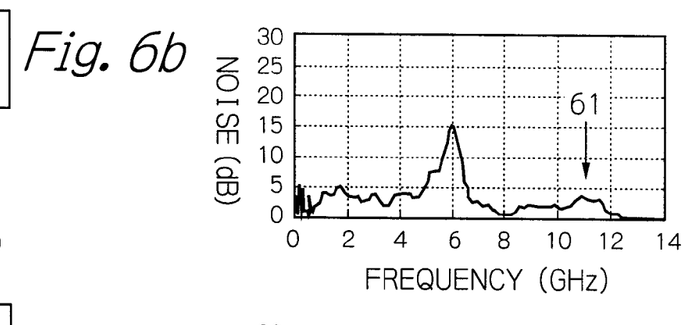
Figure 7A:
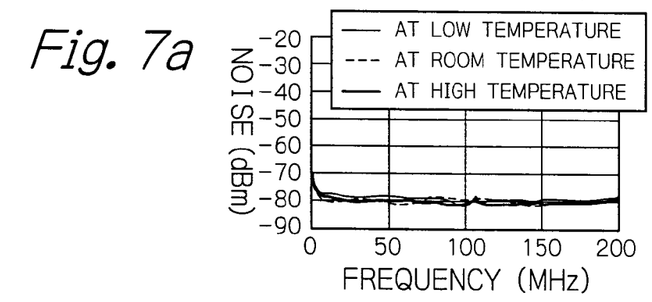
FIGS. 7a and 7b are views illustrating noise versus frequency characteristics of a good thin-film magnetic head providing no high-temperature noise.
Figure 7B:
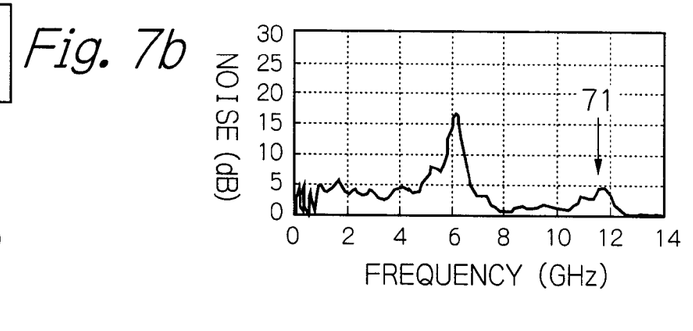

FIGS. 5a and 5b, FIGS. 6a and 6b, and FIGS. 7a and 7b illustrate noise versus frequency characteristics of good thin-film magnetic heads providing no high-temperature noise. FIGS. 5a, 6a and 7a indicate noise versus frequency characteristics under the operating frequency range of the thin-film magnetic head (0-200 MHz). The characteristics shown in these figures were measured by using a spectrum-analyzer 4396B of Hewlett-Packard Company for example. In FIGS. 5a, 6a and 7a, each lateral axis indicates a frequency by MHz and each longitudinal axis indicates a noise by dBm (0 dBm=0.001 W). In this case, the low temperature corresponds to −10° C., the room temperature corresponds to 25-30° C., and the high temperature corresponds to 85° C. FIGS. 5b, 6b and 7b indicate noise versus frequency characteristics under a wide frequency range of the thin-film magnetic head (1-14 GHz). The characteristics shown in these figures were measured by using a high-performance spectrum-analyzer E4440A of Agilent Technologies, Inc. for example. In FIGS. 5b, 6b and 7b, each lateral axis indicates a frequency by GHz and each longitudinal axis indicates a noise by dB.

These characteristics represent actually measured results of noise versus frequency characteristics of thin-film magnetic heads with TMR read head elements each having a layer structure shown in Table 1.

TABLE 1

| | | Material | Thickness (nm) |
|---|---|---|---|
| Protection Layer | | Ta | 5.0 |
| Magnetization-Free Layer | | NiFe | 5.0 |
| | | CoFe | 1.0 |
| Tunnel Barrier Layer | | Oxide of Al | 1.5-2.0 |
| Magnetization-Fixed Layer | Inner Layer | CoFe | 3.0 |
| | Nonmagnetic Intermediate Layer | Ru | 0.8 |
| | Outer Layer | CoFe | 3.0 |
| | Anti-Ferromagnetic Layer | IrMn | 7.0 |
| Under Layer | | Ru | 2.0 |
| | | Ta | 1.0 |

As will be understood from FIGS. 5a, 6a and 7a, these thin-film magnetic heads produce no noise even under high temperature environment. As will be noted also from FIGS.

5b, 6b and 7b, peaks 51, 61 and 71 resulting from FMR of the magnetization-fixed layers of such good thin-film magnetic heads are located at frequencies equal to or higher than the threshold frequency $F_{TH}$ of 10 GHz.

Figure 8A:
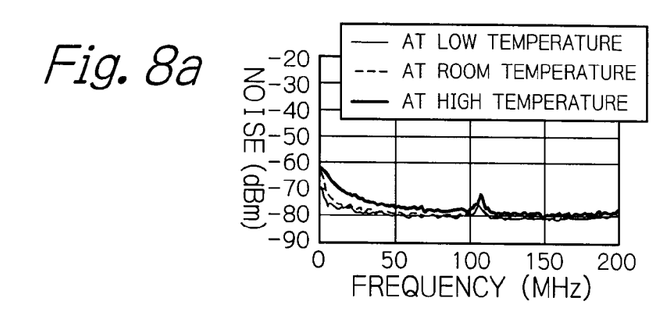
FIGS. 8a and 8b are views illustrating noise versus frequency characteristics of a defective thin-film magnetic head providing high-temperature noises.
Figure 8B:
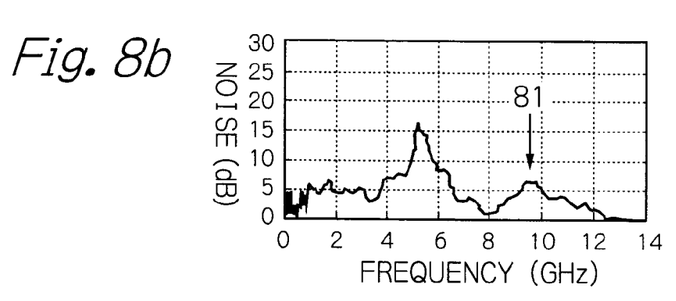
Figure 9A:
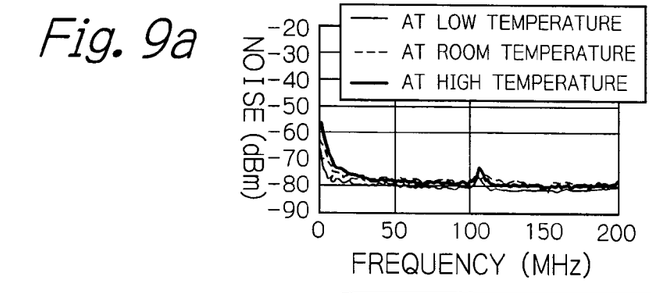
FIGS. 9a and 9b are views illustrating noise versus frequency characteristics of a defective thin-film magnetic head providing high-temperature noises.
Figure 9B:
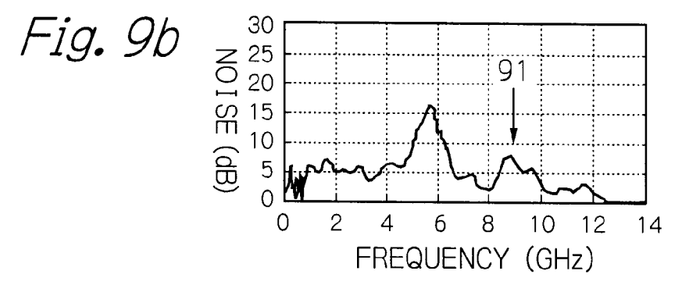
Figure 10A:
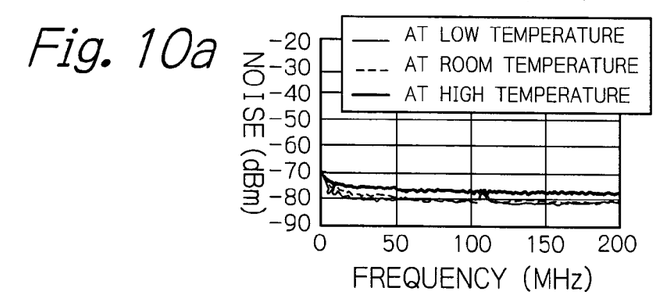
FIGS. 10a and 10b are views illustrating noise versus frequency characteristics of a defective thin-film magnetic head providing high-temperature noises.
Figure 10B:
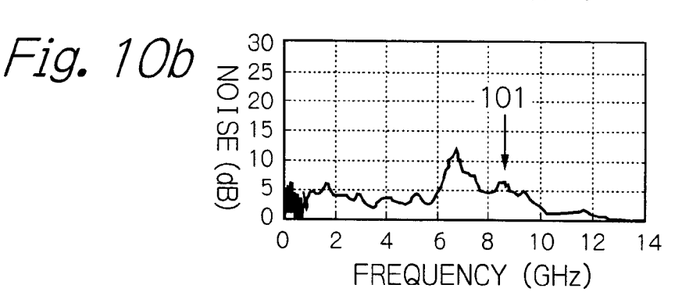

FIGS. 8a and 8b, FIGS. 9a and 9b, and FIGS. 10a and 10b illustrate noise versus frequency characteristics of defective thin-film magnetic heads providing high-temperature noises. FIGS. 8a, 9a and 10a indicate noise versus frequency characteristics under the operating frequency range of the thin-film magnetic head (0-200 MHz). FIGS. 8b, 9b and 10b indicate noise versus frequency characteristics under a wide frequency range of the thin-film magnetic head (1-14 GHz). Measuring methods of these characteristics are the same as those shown in FIGS. 5a and 5b, FIGS. 6a and 6b, and FIGS. 7a and 7b.

These characteristics also represent actually measured results of noise versus frequency characteristics of thin-film magnetic heads with TMR read head elements each having a layer structure shown in Table 1.

As will be understood from FIGS. 8a, 9a and 10a, these thin-film magnetic heads produce noises under high temperature environment. As will be noted also from FIGS. 8b, 9 and 10b peaks 81, 91 and 101 resulting from FMR of the magnetization-fixed layers of such defective thin-film magnetic heads are located at frequencies lower than the threshold frequency $F_{TH}$ of 10 GHz.

Figure 11:
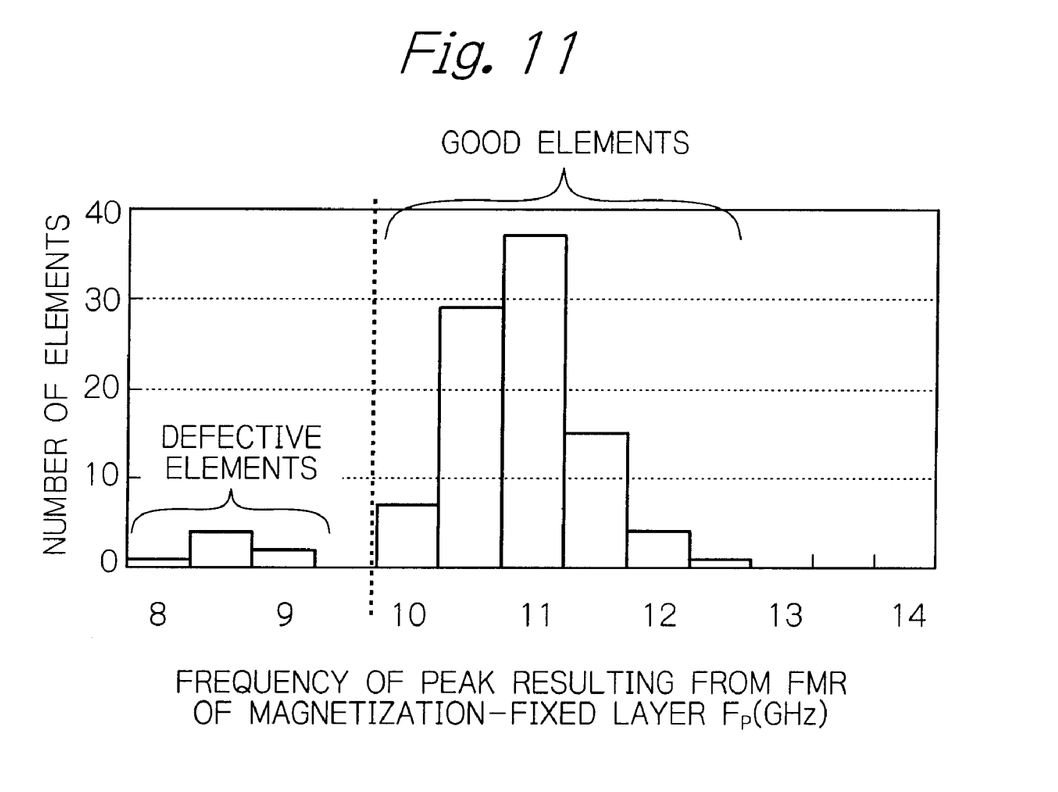
FIG. 11 is a view illustrating the number of TMR read head elements with respect to a frequency of a peak resulting from FMR of a magnetization-fixed layer of each TMR read head element, actually measured for 100 TMR read head elements.

FIG. 11 illustrates the number of TMR read head elements with respect to a frequency of a peak resulting from FMR of a magnetization-fixed layer of each TMR read head element having the layer structure shown in Table 1, actually measured for 100 TMR read head elements. In the figure, a lateral axis indicates a frequency (GHz) of a peak resulting from FMR of the magnetization-fixed layer of each TMR read head element, and a longitudinal axis indicates the number of TMR read head elements.

As shown in the figure, it was confirmed that TMR read head elements with frequencies $F_P$ of peaks equal to or higher than the threshold frequency $F_{TH}$, that is 10 GHz, were good elements providing no high-temperature noise, and that TMR read head elements with frequencies $F_P$ of peaks lower than the threshold frequency $F_{TH}$ were defective elements providing high-temperature noises. Therefore, it is possible to discriminate whether a TMR read head element is a good element or a defective element by judging whether $F_P \geq F_{TH}$ or not.

As aforementioned, according to this embodiment, a non-signal output, that is a wide band spectrum of noise, from a TMR read head element of a thin-film magnetic head to be tested is measured, a frequency $F_P$ of a peak resulting from FMR of a magnetization-fixed layer of the TMR read head element is obtained, and then whether the frequency $F_P$ of the peak is equal to or higher than a threshold frequency $F_{TH}$ of 10 GHz or not is judged so as to discriminate whether this thin-film head is a defective one providing high-temperature noises or not. Thus, it is possible to judge, under a room temperature environment, not under a high temperature environment, whether the thin-film head is a defective one providing high-temperature noises or not. As a result, extremely easy and quick test can be performed for checking whether the thin-film magnetic head is defective or not.

Figure 12:
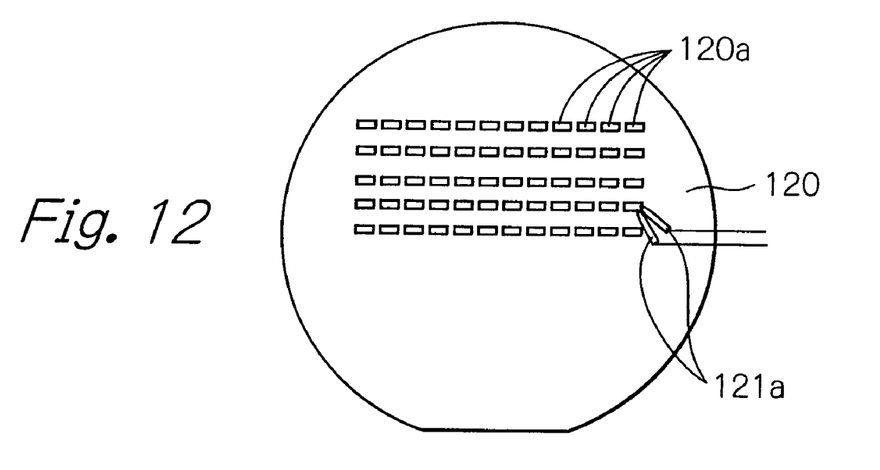
FIG. 12 is a view schematically illustrating a part of configuration for testing a thin-film magnetic head as another embodiment according to the present invention.

FIG. 12 schematically illustrates a part of configuration for testing a thin-film magnetic head as another embodiment according to the present invention.

In the above-mentioned embodiment of FIGS. 2-11, the test for checking whether a thin-film magnetic head is a defective head providing high-temperature noises or not is performed for each head arranged in a bar member. Contrary to this, in this embodiment, the test for checking whether a thin-film magnetic head is a defective head providing high-temperature noises or not is performed for each head formed on a wafer. In FIG. 12, reference numeral 120 denotes a wafer, 120a denotes many of thin-film magnetic heads arranged in matrix on the wafer 120, each head having a TMR read head element and an inductive write head element, and 121a denotes a pair of probes capable of coming into electrical contact with a pair of terminal pads (not shown) that are electrically connected to the TMR read head element. Configurations, operations and advantages of a testing apparatus in this embodiment except for the probes 121a are the same as those in the embodiment of FIGS. 2-11.

Figure 13:
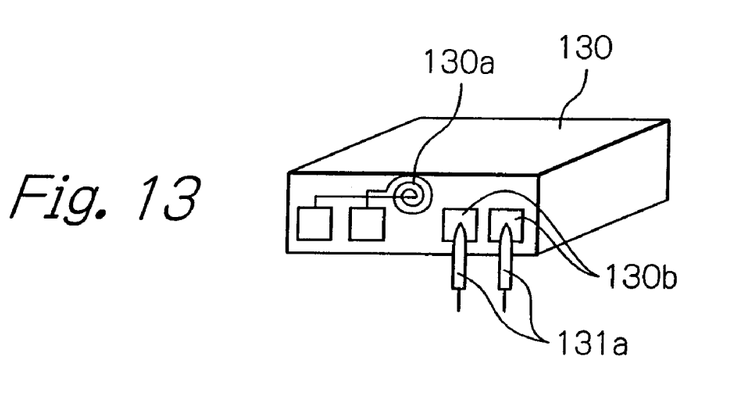
FIG. 13 is a view schematically illustrating a part of configuration for testing a thin-film magnetic head as further embodiment according to the present invention.

FIG. 13 schematically illustrates a part of configuration for testing a thin-film magnetic head as further embodiment according to the present invention.

The test for checking whether a thin-film magnetic head is a defective head providing high-temperature noises or not is performed for each head arranged in a bar member in the above-mentioned embodiment of FIGS. 2-11, and for each head arranged in a wafer in the above-mentioned embodiment of FIG. 12. Contrary to these, in this embodiment, the test for checking whether a thin-film magnetic head is a defective head providing high-temperature noises or not is performed for each head formed on a magnetic head slider individually separated. In FIG. 13, reference numeral 130 denotes a magnetic head slider, 130a denotes a thin-film magnetic head formed on the slider 130 and provided with a TMR read head element and an inductive write head element, 130b denotes a pair of terminal pads electrically connected to the TMR read head element, and 131a denotes a pair of probes capable of coming into electrical contact with the pair of terminal pads 130b. Configurations, operations and advantages of a testing apparatus in this embodiment except for the probes 131a are the same as those in the embodiment of FIGS. 2-11.

Figure 14:
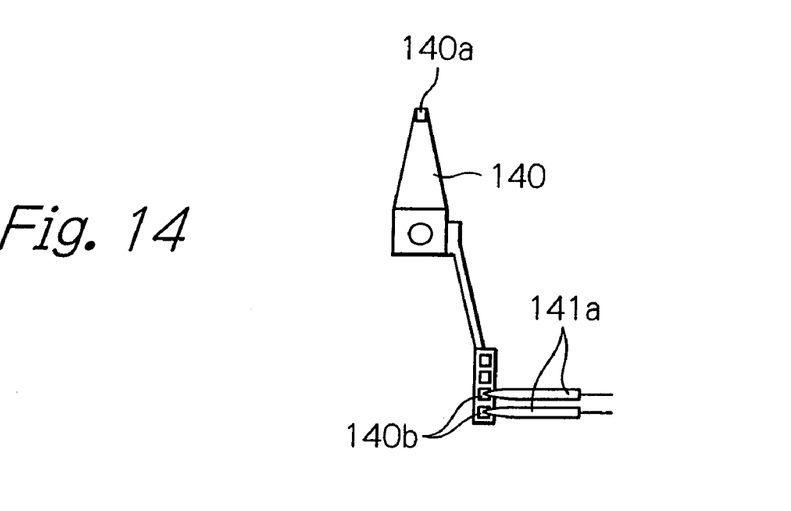
FIG. 14 is a view schematically illustrating a part of configuration for testing a thin-film magnetic head as still further embodiment according to the present invention.

FIG. 14 schematically illustrates a part of configuration for testing a thin-film magnetic head as still further embodiment according to the present invention.

The test for checking whether a thin-film magnetic head is a defective head providing high-temperature noises or not is performed for each head arranged in a bar member in the above-mentioned embodiment of FIGS. 2-11, for each head arranged in a wafer in the above-mentioned embodiment of FIG. 12, and for a head formed on a magnetic head slider in the above-mentioned embodiment of FIG. 13. Contrary to these, in this embodiment, the test for checking whether a thin-film magnetic head is a defective head providing high-temperature noises or not is performed for each head formed on a magnetic head slider assembled with a support member or suspension as a head suspension assembly. In FIG. 14, reference numeral 140 denotes a head suspension assembly formed by mounting a magnetic head slider and a wiring member on a suspension, 140a denotes the magnetic head slider with a thin-film magnetic head formed on the slider 140 and provided with a TMR read head element and an inductive write head element, 140b denotes a pair of terminal pads electrically connected to the TMR read head element, which are a part of the wiring member, and 141a denotes a pair of probes capable of coming into electrical contact with the pair of terminal pads 140b. Configurations, operations and advantages of a testing apparatus in this embodiment except for the probes 141a are the same as those in the embodiment of FIGS. 2-11.

In the aforementioned embodiments, the thin-film magnetic head has a TMR read head element. However, in modifications, a GMR read head element may be used instead of the TMR read head element. In the latter case, a nonmagnetic intermediate layer will be used instead of the tunnel barrier layer.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A testing method of a thin-film magnetic head having a magnetoresistive effect read head element with a multi-layered structure including a magnetization-fixed layer, a magnetization-free layer and a nonmagnetic intermediate layer or a tunnel barrier layer sandwiched between said magnetization-fixed layer and said magnetization-free layer, said method comprising the steps of:

feeding through said magnetoresistive effect read head element a sense current;

measuring non-signal output versus frequency characteristics of said magnetoresistive effect read head element over a frequency range that covers at least a ferromagnetic resonance of said magnetization-fixed layer; and discriminating whether said thin-film magnetic head is a head providing high-temperature noises by comparing a frequency of a peak of the non-signal output resulting from a ferromagnetic resonance of said magnetization-fixed layer with a threshold.

2. The testing method as claimed in claim 1, wherein the discriminating step comprises discriminating that said thin-film magnetic head is a head providing high-temperature noises when the frequency of the peak of the non-signal output is lower than said threshold.

3. The testing method as claimed in claim 1, wherein the discriminating step comprises obtaining a frequency at which the measured non-signal output peaks within a predetermined frequency range, and comparing the obtained frequency with said threshold.

4. The testing method as claimed in claim 1, wherein the measuring step comprises measuring non-signal output versus frequency characteristics of said magnetoresistive effect read head element over a wide frequency range of 1 GHz or more.

5. The testing method as claimed in claim 1, wherein the measuring step comprises measuring non-signal output versus frequency characteristics of said magnetoresistive effect read head element under a room-temperature environment.

6. The testing method as claimed in claim 1, wherein said thin-film magnetic head is one of thin-film magnetic heads formed on a wafer to arrange in matrix.

7. The testing method as claimed in claim 1, wherein said thin-film magnetic head is one of thin-film magnetic heads formed on a bar member to align.

8. The testing method as claimed in claim 1, wherein said thin-film magnetic head is a thin-film magnetic head formed on a magnetic head slider individually separated.

9. The testing method as claimed in claim 1, wherein said thin-film magnetic head is a thin-film magnetic head formed on a magnetic head slider individually separated and assembled with a support member.

10. The testing method as claimed in claim 1, wherein said thin-film magnetic head is a thin-film magnetic head with a giant magnetoresistive effect read head element or a tunnel magnetoresistive effect read head element.

11. A testing apparatus of a thin-film magnetic head having a magnetoresistive effect read head element with a multi-layered structure including a magnetization-fixed layer, a magnetization-free layer and a nonmagnetic intermediate layer or a tunnel barrier layer sandwiched between said magnetization-fixed layer and said magnetization-free layer, said apparatus comprising:

means for feeding through said magnetoresistive effect read head element a sense current;

means for measuring non-signal output versus frequency characteristics of said magnetoresistive effect read head element over a frequency range that covers at least a ferromagnetic resonance of said magnetization-fixed layer; and means for discriminating whether said thin-film magnetic head is a head providing high-temperature noises by comparing a frequency of a peak of the non-signal output resulting from a ferromagnetic resonance of said magnetization-fixed layer with a threshold.

12. The testing apparatus as claimed in claim 11, wherein the discriminating means comprises means for discriminating that said thin-film magnetic head is a head providing high-temperature noises when the frequency of the peak of the non-signal output is lower than said threshold.

13. The testing apparatus as claimed in claim 11, wherein the discriminating means comprises means for obtaining a frequency at which the measured non-signal output peaks within a predetermined frequency range, and means for comparing the obtained frequency with said threshold.

14. The testing apparatus as claimed in claim 11, wherein the measuring means comprises means for measuring non-signal output versus frequency characteristics of said magnetoresistive effect read head element over a wide frequency range of 1 GHz or more.

15. The testing apparatus as claimed in claim 11, wherein the measuring means comprises means for measuring non-signal output versus frequency characteristics of said magnetoresistive effect read head element under a room-temperature environment.

16. The testing apparatus as claimed in claim 11, wherein said thin-film magnetic head is one of thin-film magnetic heads formed on a wafer to arrange in matrix.

17. The testing apparatus as claimed in claim 11, wherein said thin-film magnetic head is one of thin-film magnetic heads formed on a bar member to align.

18. The testing apparatus as claimed in claim 11, wherein said thin-film magnetic head is a thin-film magnetic head formed on a magnetic head slider individually separated.

19. The testing apparatus as claimed in claim 11, wherein said thin-film magnetic head is a thin-film magnetic head formed on a magnetic head slider individually separated and assembled with a support member.

20. The testing apparatus as claimed in claim 11, wherein said thin-film magnetic head is a thin-film magnetic head with a giant magnetoresistive effect read head element or a tunnel magnetoresistive effect read head element.

* * * * *